(12) United States Patent
Chien (10) Patent No.: US 10,135,393 B2
(45) Date of Patent: Nov. 20, 2018

(54) SIGNAL DETECTOR INCLUDING A SET OF RESISTORS AND A COLLECTION UNIT FOR GENERATING A DETECTION SIGNAL

(71) Applicant: RichWave Technology Corp., Taipei (TW)

(72) Inventor: Hwey-Ching Chien, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/658,409

(22) Filed: Jul. 25, 2017

(65) Prior Publication Data

US 2018/0191305 A1    Jul. 5, 2018

(30) Foreign Application Priority Data

Dec. 30, 2016    (TW) .............................. 105144072 A (51) Int. Cl.
*H03G 3/20*    (2006.01)
*H03F 1/02*    (2006.01)
*H03F 3/04*    (2006.01)
*G01R 19/00*    (2006.01)

(52) U.S. Cl.
CPC ............... *H03F 1/02* (2013.01); *G01R 19/00* (2013.01); *H03F 3/04* (2013.01)

(58) Field of Classification Search
CPC ............................ H03G 3/20; H03F 2200/471
USPC .................................................. 330/144, 284
See application file for complete search history.

(56) References Cited

U.S. PATENT DOCUMENTS

| 5,604,460 | A   | 2/1997 | Sehrig |
| 6,408,008 | B1  | 6/2002 | Komarek |
| 6,879,816 | B2* | 4/2005 | Bult .................... H01F 17/0006 |
|           |     |        |   257/E27.046 |
| 7,242,245 | B2  | 7/2007 | Burns |
| 2006/0084469 | A1 | 4/2006 | Malone |
| 2014/0266832 | A1 | 9/2014 | Schrom |

FOREIGN PATENT DOCUMENTS

TW    201409949 A    3/2014

* cited by examiner

*Primary Examiner* — Steven J Mottola
(74) *Attorney, Agent, or Firm* — Winston Hsu (57) ABSTRACT

A signal detector includes a signal input terminal, N first resistors, (N−1) second resistors, a third resistor, M voltage-to-current units and a collection unit. A first terminal of a $1^{st}$ first resistor is coupled to the signal input terminal. A first terminal of an $i^{th}$ first resistor is coupled to a second terminal of an $(i-1)^{th}$ first resistor. A first terminal of a $k^{th}$ second resistor is coupled to a second terminal of a $k^{th}$ first resistor. A second terminal of each second resistor is coupled to a reference voltage terminal. The third resistor is coupled between the reference voltage terminal and a second terminal of an $N^{th}$ first resistor. Each voltage-to-current unit is coupled to a first terminal of a corresponding first resistor for converting a corresponding detection voltage to a detection current. The collection unit is coupled to the M voltage-to-current units for generating a detection signal according to at least the M detection currents.

20 Claims, 10 Drawing Sheets

SIGNAL DETECTOR INCLUDING A SET OF RESISTORS AND A COLLECTION UNIT FOR GENERATING A DETECTION SIGNAL

CROSS REFERENCE TO RELATED APPLICATION

This application claims priority of Taiwan application No. 105144072, which was filed on Dec. 30, 2016, and is included herein by reference.

TECHNICAL FIELD

The present application provides a signal detector, and more particularly, a signal detector including a set of resistors and a collection unit for generating a detection signal.

BACKGROUND

In a prior art, signal detector requires a plurality of rectifiers. Each rectifier converts a received alternative current (AC) signal to a direct current (DC) signal. Then, a collection unit collects and adds the DC signals to generate a detection signal to evaluate the intensity of the received signal. The foresaid structure of the receiver may be usable, but has shortcomings as described below.

When connecting a set of amplifiers in cascade, a cascade effect may occur, so the frequency bandwidth of the receiver is seriously constrained. For example, if the 3 dB frequency bandwidth of each amplifier is fs, when connecting N amplifiers in cascade, the 3 dB frequency bandwidth of the whole structure becomes ft, and the relation equation is $ft=fs \times (2^{1/N}-1)^{1/2}$. Hence, when the number of stages increases, the overall frequency bandwidth reduces. In order to broaden the frequency bandwidth of the whole structure, high bandwidth amplifiers may be selected to be the amplifiers at all stages. However, this will inevitably increase power consumption. To avoid using high bandwidth amplifiers at all stages, the bandwidth of an amplifier at a latter stage would require a larger bandwidth. This would make the multi-amplifier structure more inconsistent and increase the difficulty of design. Moreover, when each amplifier has a gain As, N amplifiers connected in cascade will have a total gain At, the equation is $At=(As)^N$. Hence, the gain error would accumulate stage by stage, making the accuracy of the gain vulnerable to temperature or process variations. A solution is required to solve the problems mentioned above in the field.

SUMMARY

An embodiment may provide a signal detector including a signal input terminal, N first resistors, (N−1) second resistors, a third resistor, N first nodes, M primary voltage-to-current units and a collection unit. A first terminal of a 1st first resistor is coupled to the signal input terminal, and a first terminal of an ith first resistor is coupled to a second terminal of an (i−1)th first resistor. A first terminal of a kth second resistor is coupled to a second terminal of a kth first resistor, and a second terminal of each second resistor is coupled to a reference voltage terminal. A third resistor includes a first terminal coupled to a second terminal of an Nth first resistor and a second terminal coupled to the reference voltage terminal. A 1st first node is coupled between the signal input terminal and the first terminal of the 1st first resistor, an ith first node is coupled between the second terminal of the (i−1)th first resistor and the first terminal of the ith first resistor. Each primary voltage-to-current unit converts a corresponding detection voltage to a detection current, includes an input terminal coupled to a first terminal of a corresponding first resistor via a corresponding first node to receive the corresponding detection voltage, and includes an output terminal to output the detection current. A collection unit is coupled to output terminals of the M primary voltage-to-current units and used to generate a detection signal according to at least M detection currents outputted from the M primary voltage-to-current units.

Another embodiment may provide a signal detector including a signal input terminal, a first attenuation unit, a second attenuation unit, a first voltage-to-current unit, a second voltage-to-current unit, and a collection unit. The signal input terminal is used to receive an received signal. The first attenuation unit includes a first node; and a common node coupled to a reference voltage terminal. The first attenuation unit is used to provide a first equivalent resistance looking from the first node to the common node. The second attenuation unit includes a first node coupled to the signal input terminal; a second node coupled to the first node of the first attenuation unit; and a common node coupled to the reference voltage terminal. The second attenuation unit is used to provide a second equivalent resistance looking from the first node to the second node and the common node, and the first equivalent resistance is substantially equal to the second equivalent resistance. The first voltage-to-current unit is used to convert a detection voltage to a detection current including an input terminal coupled to a first node of the first attenuation unit to receive the detection voltage, and an output terminal to output the detection current. The second voltage-to-current unit is used to convert a detection voltage to a detection current and includes an input terminal coupled to a first node of the second attenuation unit to receive the detection voltage, and an output terminal to output the detection current. The collection unit is coupled to the output terminal of the first voltage-to-current unit and the output terminal of the second voltage-to-current unit, and used to generate a detection signal according to the detection current of the first voltage-to-current unit and the detection current of the second voltage-to-current unit.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
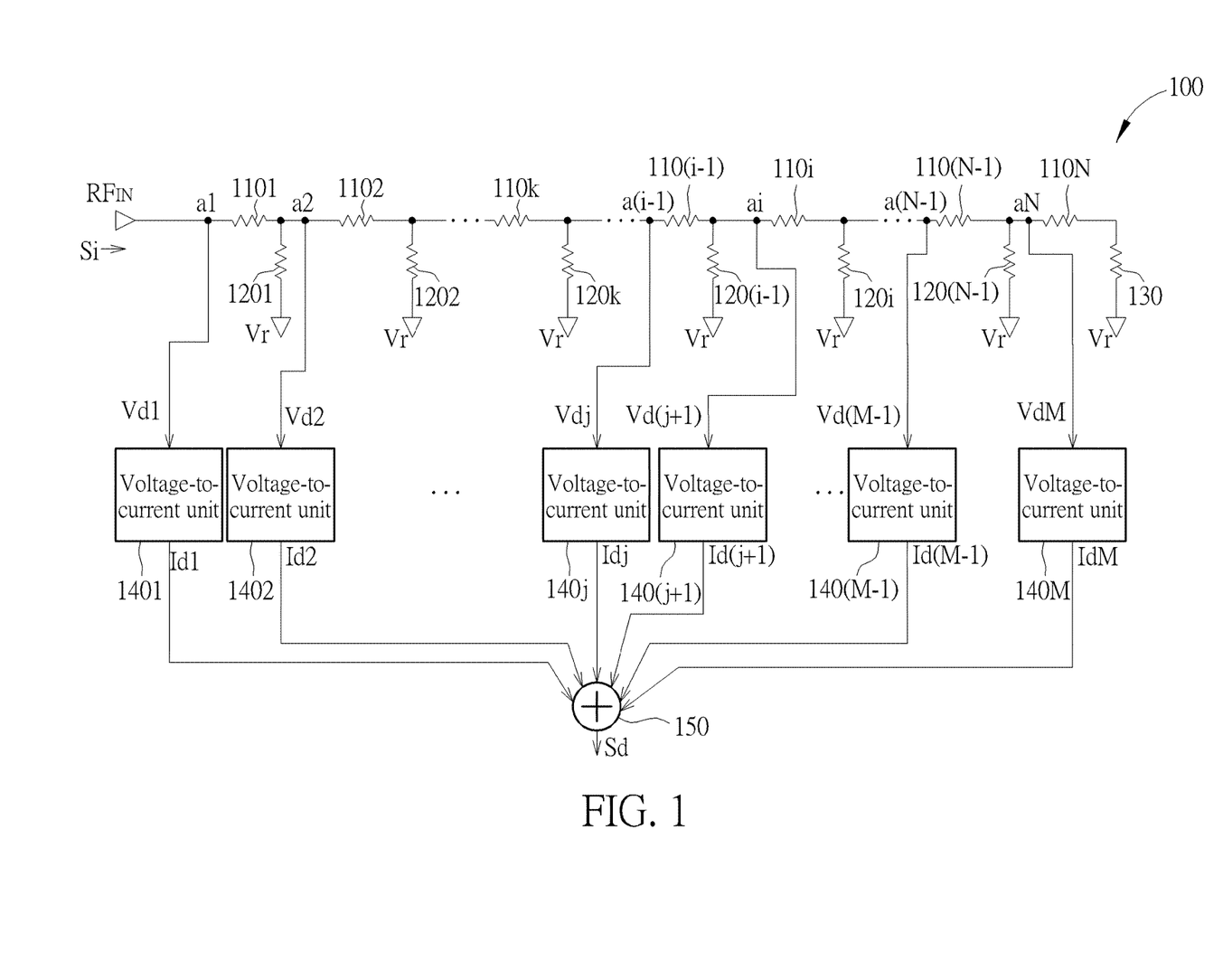
FIG. 1 illustrates a signal detector according to an embodiment.

FIG. 1 illustrates a signal detector 100 according to an embodiment. The signal detector 100 may include a signal input terminal $RF_{IN}$, N first resistors 1101-110N, (N−1) second resistors 1201-120(N−1), a third resistor 130, N first nodes a1-aN, M primary voltage-to-current units 1401-140M and a collection unit 150. The resistors 1101-110N may have identical resistances substantially. The resistors 1201-120(N−1) may have identical resistances substantially. A first terminal of a resistor 1101 may be coupled to the signal input terminal $RF_{IN}$. A first terminal of a resistor 110i may be coupled to a second terminal of a resistor 110(i−1). Regarding the resistors 1201-120(N−1), a first terminal of a resistor 120k is coupled to a second terminal of a resistor 110k. A second terminal of each of the resistors 1201-120(N−1) may be coupled to a reference voltage terminal Vr. The reference voltage terminal Vr may be (but not limited to) a ground terminal. The resistor 130 may include a first terminal coupled to a second terminal of the resistor 110N and a second terminal coupled to the reference voltage terminal Vr. The resistors 110N and 130 may be integrated into a single resistor having an resistance value equal to the sum of the resistance values of resistors 110N and 130. Regarding the nodes a1-aN, the node a1 may be coupled between the signal input terminal $RF_{IN}$ and the first terminal of the resistor 1101. The node ai may be coupled between the second terminal of the resistor 110(i−1) and the first terminal of the resistor 110i. Regarding the voltage-to-current units 1401-140M, a jth voltage-to-current unit 140j may convert a corresponding detection voltage Vdj to a detection current Idj, and the detection voltage Vdj may be a divided voltage. Each voltage-to-current unit may include an input terminal and an output terminal. The input terminal of the voltage-to-current unit 140j may be coupled to the first terminal of one corresponding resistor of the resistors 1101-110N via a corresponding one of the nodes a1-aN for receiving the detection voltage Vdj. The output terminal of the voltage-to-current unit 140j may send the detection current Idj. The collection unit 150 may be coupled to the output terminals of the voltage-to-current units 1401-140M and used to generate a detection signal Sd according to at least the M detection currents Id1-IdM outputted from the voltage-to-current units 140. The mentioned variables N, i, k and M are positive integers, $2 \leq i \leq N$, $1 \leq j \leq M$, $1 \leq k \leq (N-1)$, and $2 \leq M \leq N$. In FIG. 1, it is merely an example that the resistor 110k is arranged before the resistor 110(i−1). According to embodiments, it is not necessary to connect a voltage-to-current unit to each of the nodes a1-aN. The arrangement and use of the voltage-to-current units may be adjusted according to demand. The variable M may be smaller than or equal to the variable N. In this application, the voltage-to-current unit 1401 being closest to the signal input terminal $RF_{IN}$ may be regarded to be a first stage. The voltage-to-current unit 1402 being secondarily closest to the signal input terminal $RF_{IN}$ may be regarded to be a second stage, and so on. The signal input terminal $RF_{IN}$ may be an antenna, or a terminal or component used to receive the received signal Si.

Figure 2:
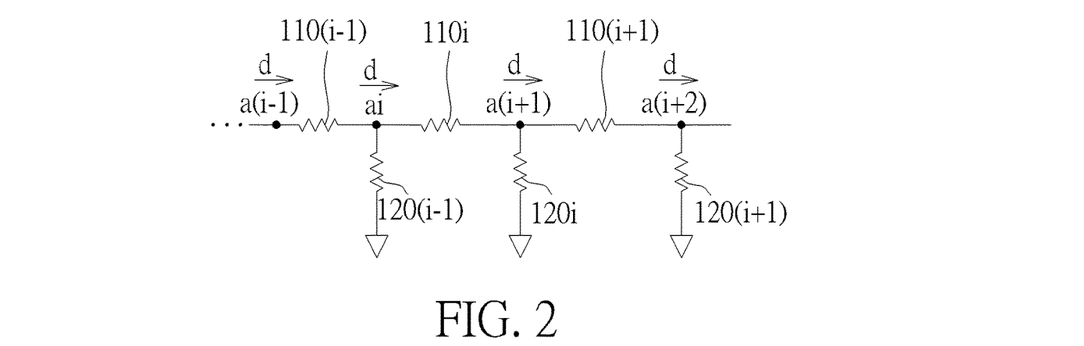
FIG. 2 illustrates a part of the signal detector shown in FIG. 1.

FIG. 2 illustrates a part of the signal detector 100 shown in FIG. 1. According to an embodiment, in the signal detector 100, the equivalent resistances looking towards corresponding resistors 1101-110N from the nodes a1-aN may be identical. For example, the equivalent resistances looking towards the direction d from the nodes a (i−1), ai, a (i+1) and a (i+2) may be identical substantially. In order to have identical equivalent resistances looking towards the direction d from the nodes a1-aN to the resistors 1101-110N, the ratio of the resistances of the resistors 1101-110N, 1201-120(N−1) and 130 may be adjusted.

Figure 3:
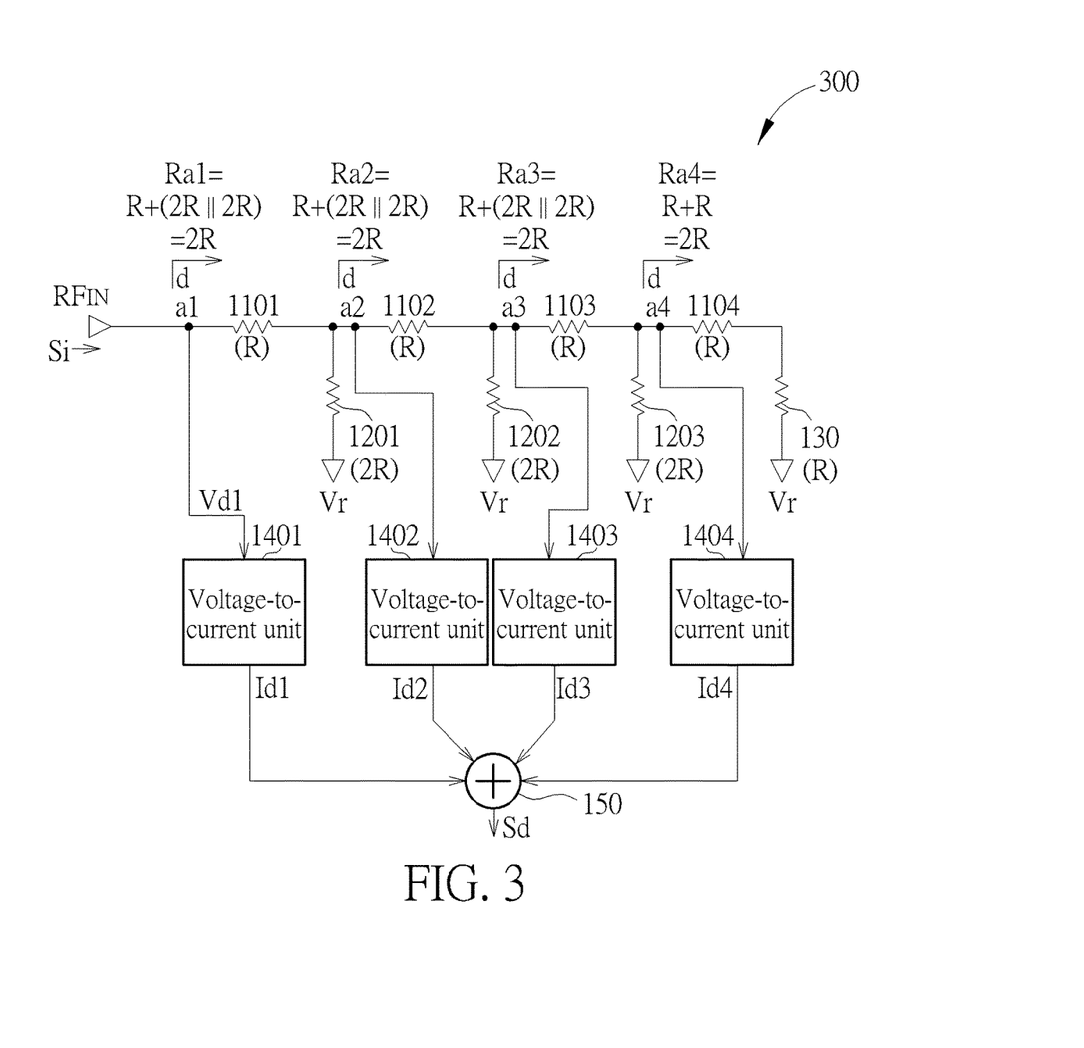
FIG. 3 illustrates a signal detector according to another embodiment.

FIG. 3 illustrates a signal detector 300 according to an embodiment. The signal detector 300 may be an example of the signal detector 100 with the variable N to be 4. The structure of FIG. 3 is merely an example instead of limiting the scope of the present application. In order to have identical equivalent resistances looking towards the direction d from the nodes a1-a4, the ratio of the resistance of each resistor 1101-1104, the resistance of each resistor 1201-1203 and the resistance of the resistor 130 may be adjusted to be 1:2:1 substantially. In other words, when each of the resistors 1101-1104 has a resistance R, each of the resistors 1201-1203 may have a resistance 2R, and the resistor 130 may have a resistance R. Hence, the equivalent resistance Ra4 at the node a4 may be a resistance of connecting the resistors 1104 and 130 in series, that is 2R. The equivalent resistance Ra3 at the node a3 may be calculated by adding the resistance of the resistor 1103 and a parallel resistance calculated with the resistance of the resistor 1203 and the foresaid equivalent resistance Ra4. The equation may be Ra3=R+(2R∥Ra4)=R+(2R∥2R)=2R. Similarly, the equivalent resistances Ra2 and Ra1 at the nodes a2 and a1 may be calculated to be 2R respectively. Hence, the equivalent resistances at each of the nodes a1-a4 may be identical substantially. The ratio of resistances described above is merely an example. The ratio of the resistance of the resistors 1101-110N, 1201-120(N−1) and 130 may be adjusted to be 1:0.75:0.5 or 1:4/9:1/3 substantially to have identical equivalent resistances looking towards the direction d from the nodes a1-aN.

Figure 4:
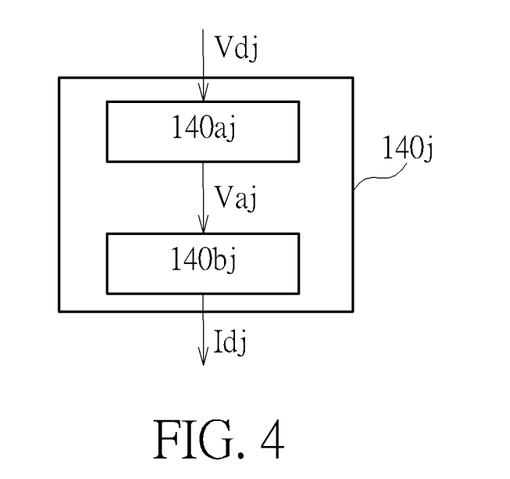
FIG. 4 illustrates a block diagram of a voltage-to-current unit according to an embodiment.

FIG. 4 illustrates a block diagram of the voltage-to-current unit 140j according to an embodiment. Each of the voltage-to-current unit 140j shown in FIG. 1 and FIG. 3 may include an amplifier 140aj and a rectifier 140bj. The amplifier 140aj may amplify a corresponding detection voltage Vdj so as to generate an amplified signal Vaj, and include a first terminal to receive the detection voltage Vdj and a second terminal to send the amplified signal Vaj. The rectifier 140bj may rectify the amplified signal Vaj to generate a detection current Idj, and include a first terminal coupled to the second terminal of the amplifier 140aj to receive the amplified signal Vaj, and a second terminal coupled to an output terminal of the voltage-to-current unit 140j to send the detection current Idj.

According to another embodiment, the signal detector 300 may act as a log power detector, and the amplifier 140aj may be a limiting amplifier. In this embodiment, the amplifier 140aj may provide a fixed increment of the amplified signal Vaj after entering a saturation state so that the linearity in dB of the log power detector may be improved.

Figure 5:
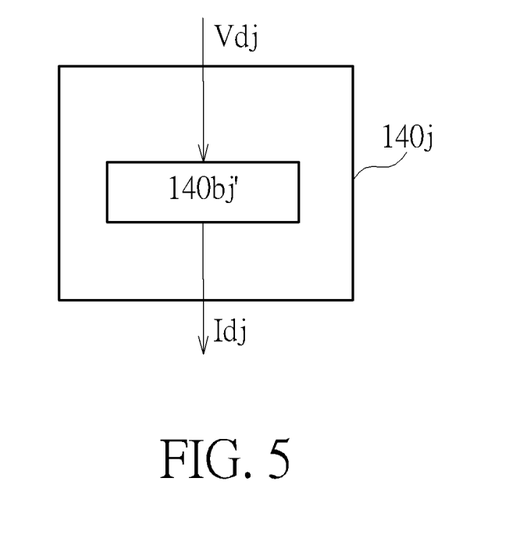
FIG. 5 illustrates a block diagram of a voltage-to-current unit according to another embodiment.

FIG. 5 illustrates a block diagram of the voltage-to-current unit 140j according to another embodiment. In FIG. 5, the voltage-to-current unit 140j may include a rectifier 140bj' used to rectify the detection voltage Vdj to generate the detection current Idj. The rectifier 140bj' may include a first terminal coupled to the input terminal of the voltage-to-current unit 140j to receive the detection voltage Vdj, and a second terminal coupled to the output terminal of the voltage-to-current unit 140j to output the detection current Idj.

Figure 6:
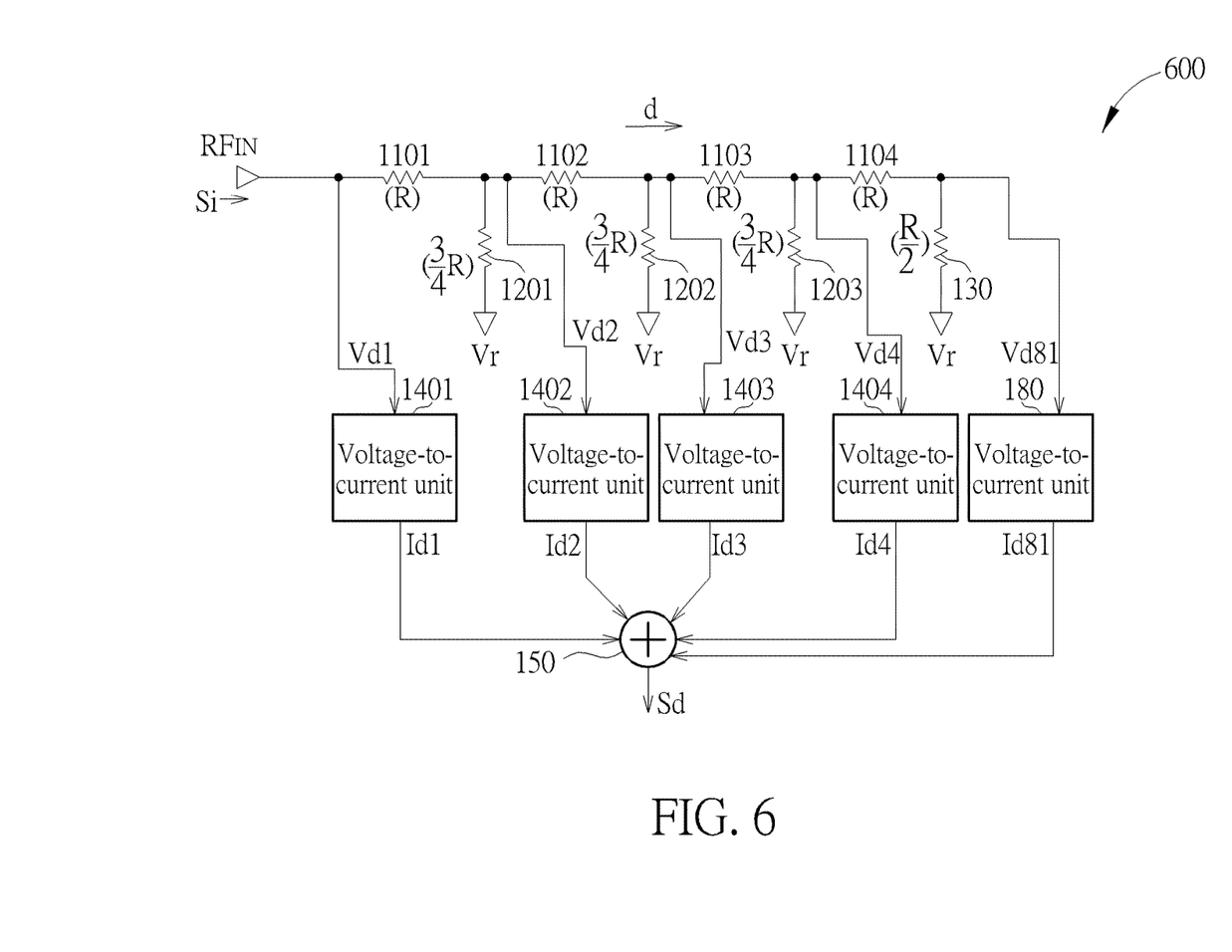
FIG. 6 illustrates a signal detector according to another embodiment.
Figure 7:
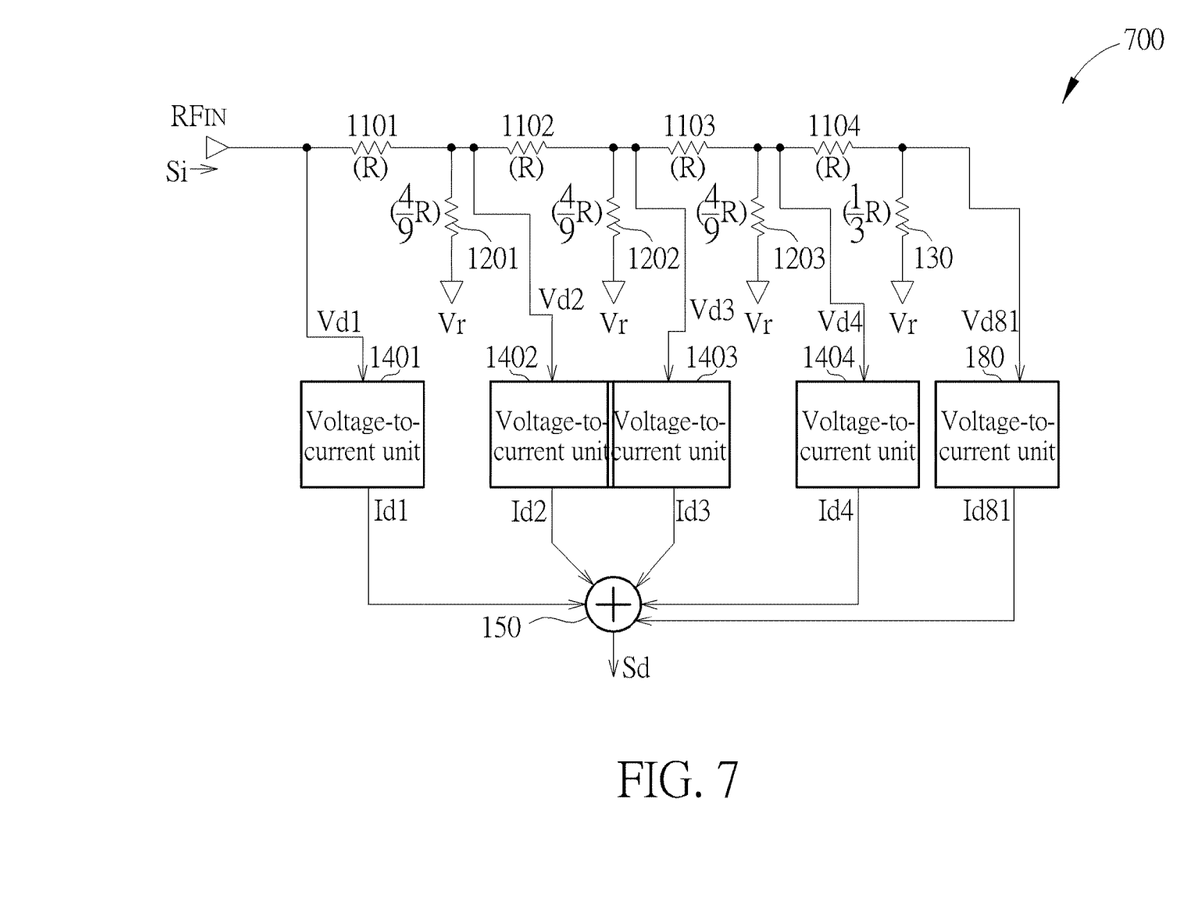
FIG. 7 illustrates a signal detector according to another embodiment.

The problems of a prior technique may be lessened according to embodiments. As shown in FIG. 1, the received signal Si is received by the signal input terminal $RF_{IN}$. The received signal Si may avoid being sent through multiple stages of voltage-to-current units in series because the voltage-to-current units 1401-140M shown in FIG. 1 are not connected in series. When the structure of the voltage-to-current unit 140j including the amplifier 140aj in FIG. 4 is used, the received signal Si processed by the signal detector 100 may not be transmitted via a plurality of amplifiers connected in series. Hence, the problem of reducing the total bandwidth may be prevented. In other words, when the amplifier 140aj of each stage has a bandwidth fs, the total bandwidth ft may be calculated as $ft=fsx(2^{1/N}-1)^{1/2}$ if N stages of amplifiers are in series. Because the received signal Si may be transmitted via only 1 stage of amplifier, the total bandwidth ft may be equal to the bandwidth fs of a single amplifier by setting N=1. When the number of amplifiers increases, the total bandwidth may be kept the same, removing the need to use high bandwidth amplifiers, and the total power consumption may be kept within an acceptable range. According to an embodiment, when the intensity of the received signal increases, the amplifiers of the voltage-to-current units may be saturated stage by stage. For example, after the amplifier 140a1 of the voltage-to-current unit 1401 is saturated, if the intensity of the received signal Si is high enough, the amplifier 140a2 of the voltage-to-current unit 1402 may be saturated. Then, if the intensity of the received signal Si is still high enough, the amplifier 140a3 of the voltage-to-current unit 1403 may also be saturated, and so on. In a cascade structure of amplifier provided by prior techniques, when the intensity of the received signal Si is high enough, the last stage amplifier may be saturated first, then the second last stage amplifier may be saturated, and so on. Hence, the required time to stabilize the amplifier structure of prior techniques is longer than the time to stabilize the structure of embodiments of the present invention. Considering the reflection coefficient, the performance of the signal detector shown in FIG. 1 may be improved. Taking FIG. 3 as an example, the equivalent resistances (i.e. the loading resistances) looking towards the direction d from the nodes a1-a4 may be calculated to be 2R. The input terminal resistances looking toward the signal input terminal may be R. Hence, the reflection coefficient may be calculated with a formula as $\Gamma=(Z-Zs)/(Z+Zs)=(2R-R)/(2R+R)=1/3$, where $\Gamma$ is the reflection coefficient, Z is the loading resistance, and Zs is the input terminal resistance. Furthermore, a voltage standing wave ratio (VSWR hereinafter) may be calculated as $VSWR=(1+\Gamma)/(1-\Gamma)=2:1$ according to a formula, and the power transmission ratio corresponding to the VSWR of 2:1 may be up to 88.9%, so the performance may be improved. By adjusting the resistances of the resistors, the VSWR of an embodiment may be less than 2:1, so the power transmission ratio may be further improved. As described above, in the circuit structure provided by an embodiment, the equivalent resistances at the nodes a1-aN may be identical, so the reflection coefficient, the VSWR and the power transmission ratio corresponding to each of the nodes a1-aN are optimized. Regarding prior art, the equivalent resistances calculated at the nodes connecting to the amplifiers are not identical, so the power transmission ratios at the nodes are quite low. Regarding transconductance, the signal detector of an embodiment of the present invention is also improved. The intensity of the signal is divided by a constant (e.g. 2 in FIG. 3) at each stage of amplifier by adjusting the resistances of the resistors 1101-110N, 1201-120(N−1) and 130. Hence, errors caused by variety of manufacture processes or temperatures may be compensated and reduced when calculating the detection voltages. A higher accuracy is reached by performing divisions with a constant divisor stage by stage. The circuit of the signal detector of an embodiment is manufactured in an integrated circuit (IC) to be an on-chip form. The foresaid resistors may be integrated into an IC. In addition, the passive components such as resistors and capacitors (described below) may be allowed to have smaller resistances and capacitances. For example, the resistor may merely be 50 ohms. The RC effect and dimensions of the circuit are reduced FIG. 6 illustrates a signal detector 600 according to an embodiment. FIG. 7 illustrates a signal detector 700 according to an embodiment. As described above, the ratio of the resistances of the resistors 1101-110N, 1201-120(N−1) and 130 may be adjusted so that the equivalent resistances looking towards the direction which the received signal Si transmits from the nodes a1-aN are identical. The signal detectors 600-700 may be examples by setting the variable N as 4. The ratios of the resistances of the resistors 1101-110N, 1201-120(N−1) and 130 may be 1:0.75:0.5 in FIG. 6 and 1:4/9:1/3 in FIG. 7. The principles and effects may be similar to the example of FIG. 3, so the description is not repeated. In FIG. 6 and FIG. 7, each of the signal detectors 600 and 700 may include a voltage-to-current unit 180. The voltage-to-current unit 180 may convert a corresponding detection voltage Vd8 to a detection current Id8. The voltage-to-current unit 180 may include an input terminal coupled to the second terminal of the resistor 110N (e.g. the resistor 1104 in FIGS. 7-8) and used to receive the detection voltage Vd81, and an output terminal coupled to the collection unit 150 and used to output the detection current Id81 to the collection unit 150. The collection unit 150 may generate the detection signal Sd according to the M detection current (e.g. Id1-IdM in FIG. 1 or Id1-Id4 in FIGS. 6-7) and the detection current Id81. Using the voltage-to-current unit 180 may increase the detection resolution by one more stage so as to improve the accuracy of the detection signal Sd.

According to embodiments, the collection unit 150 in FIG. 1 may be (but not limited to) an adder used to add at least the M detection current (e.g. Id1-IdM) to obtain a total current and convert the total current to the detection signal Sd. The received signal Si may be an AC signal, and a value of the detection signal Sd may correspond to intensity of the received signal Si. In other words, value of the detection signal Sd may be used to detect the value of the received signal Si.

Figure 8:
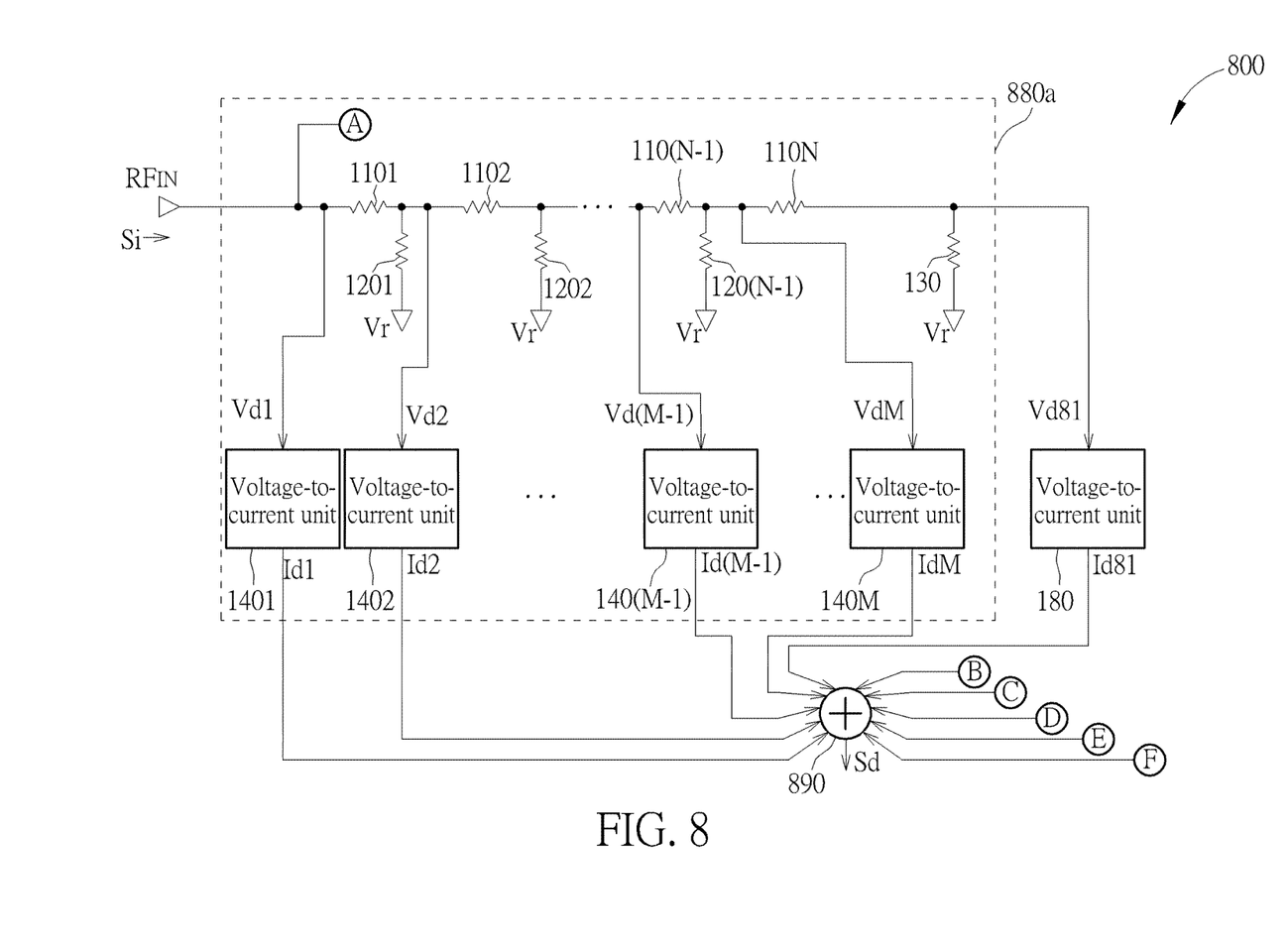
FIG. 8 and FIG. 9 illustrate a signal detector according to another embodiment.
Figure 9:
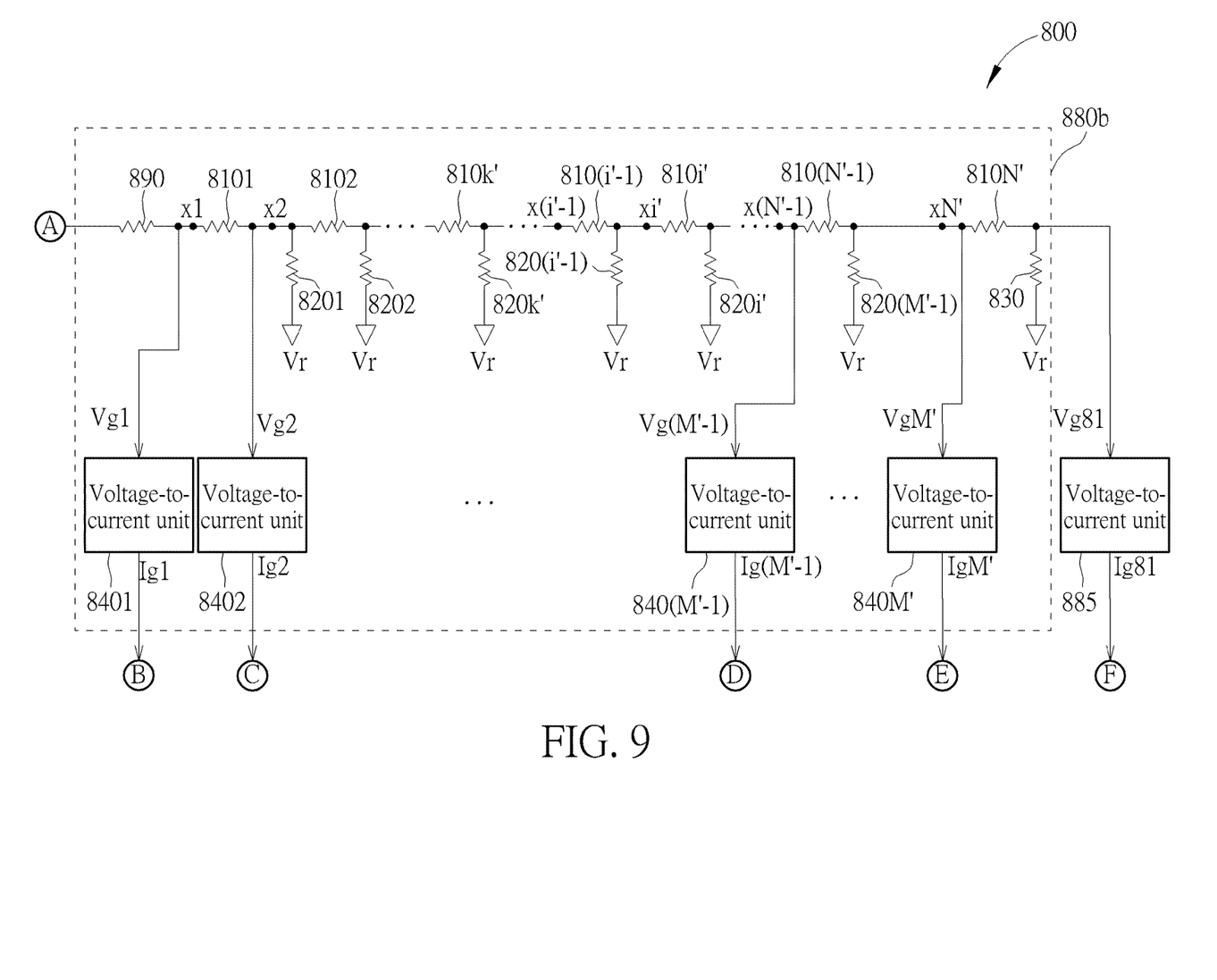

FIG. 8 and FIG. 9 illustrate a signal detector 800 according to an embodiment. As shown in FIGS. 8-9, the signal detector 800 may include a circuit part 880a and circuit part 880b. The structure of the circuit part 880a may be similar to the structure of FIG. 1, so it is not described repeatedly. The circuit part 880b may include a resistor 890, N' resistors 8101-810N', (M'−1) resistors 8201-820(M'−1), a resistor 830, N' nodes x1-xN', and M' voltage-to-current units 8401-840M'. The resistor 890 may include a first terminal coupled to the signal input terminal $RF_{IN}$, and a second terminal. In the resistors 8101-810N', a resistor 8101 may include a first terminal coupled to the second terminal of the resistor 890, and a resistor 810i' may include a first terminal coupled to a second terminal of a resistor 810(i'−1). In the resistor 8201-820(M'−1), a resistor 820k' may include a first terminal coupled to a second terminal of a resistor 810k'. Each of the resistors 8201-820M' may include a second terminal coupled to a reference voltage terminal Vr. The resistor 830 may include a first terminal coupled to a second terminal of the resistor 810N', and a second terminal coupled to the reference voltage terminal Vr. In the nodes x1-xN', the node x1 may be coupled between the second terminal of the resistor 890 and the first terminal of the resistor 8101. A node xi' may be coupled between the second terminal of the resistor 810(i'−1) and the first terminal of the resistor 810i'. In the voltage-to-current units 8401-840M', a voltage-to-current unit 840j' may convert a detection voltage Vgj' to a detection current Igj'. The voltage-to-current unit 840j' may include an input terminal coupled to a first terminal of a corresponding resistor of the resistors 8101-810N' to receive the detection voltage Vgj', and an output terminal to output the detection current Igj'. As shown in FIGS. 8-9, the voltage-to-current units 8401-840M' may receive detection voltages Vg1-VgM' respectively, and output the detection currents Ig1-IgM' respectively. The collection unit 150 may be coupled to the output terminals of the voltage-to-current units 1401-140M and 8401-840M' to receive the detection currents Id1-IdM and Ig1-IgM'. The foresaid variables N', i', k' and M' are positive integers, where $2 \leq i' \leq N'$, $1 \leq k' \leq (N'-1)$, $2 \leq M' \leq N'$, and $1 \leq j' \leq M'$. According to an embodiment, the signal detector 800 may further include a voltage-to-current unit 180 and a voltage-to-current unit 885. The voltage-to-current unit 885 may include an input terminal coupled to the second terminal of the resistor 810N' to receive a detection voltage Vg81, and an output terminal to output the detection current Ig81. The collection unit 150 may be coupled to the output terminals of the voltage-to-current units 1401-140M, 180, 8401-840M' and 885 to receive the detection currents Id1-IdM, Id81, Ig1-IgM' and Ig81 and generate the detection signal Sd accordingly for determining the intensity of the received signal Si. Similar to FIG. 1 and FIG. 3, in FIGS. 8-9, an equivalent resistance looking towards the resistor 810i' from the node xi' of the nodes x1-xN may be kept identical substantially. For example, an equivalent resistance looking towards the resistor 8101 from the node x1, an equivalent resistance looking towards the resistor 8102 from the node x2, and an equivalent resistance looking towards the resistor 810N' from the node xN' may be identical substantially. For example, the ratio of the resistances of the resistors 1101-110N, 1201-120(N−1), 130, 890, 8101-810N', 8201-820(M'−1) and 830 may be set as 1:2:1:30:1:2:1 substantially to have the equivalent resistances looking towards corresponding resistors from the nodes a1-aN and x1-xN' to be identical substantially. According to an embodiment, by means of the structure having a plurality of circuit parts shown as FIGS. 8-9, the unwanted capacitance effect caused by connecting a plurality of stages of circuit may be decreased. The total bandwidth may be broadened.

Figure 10:
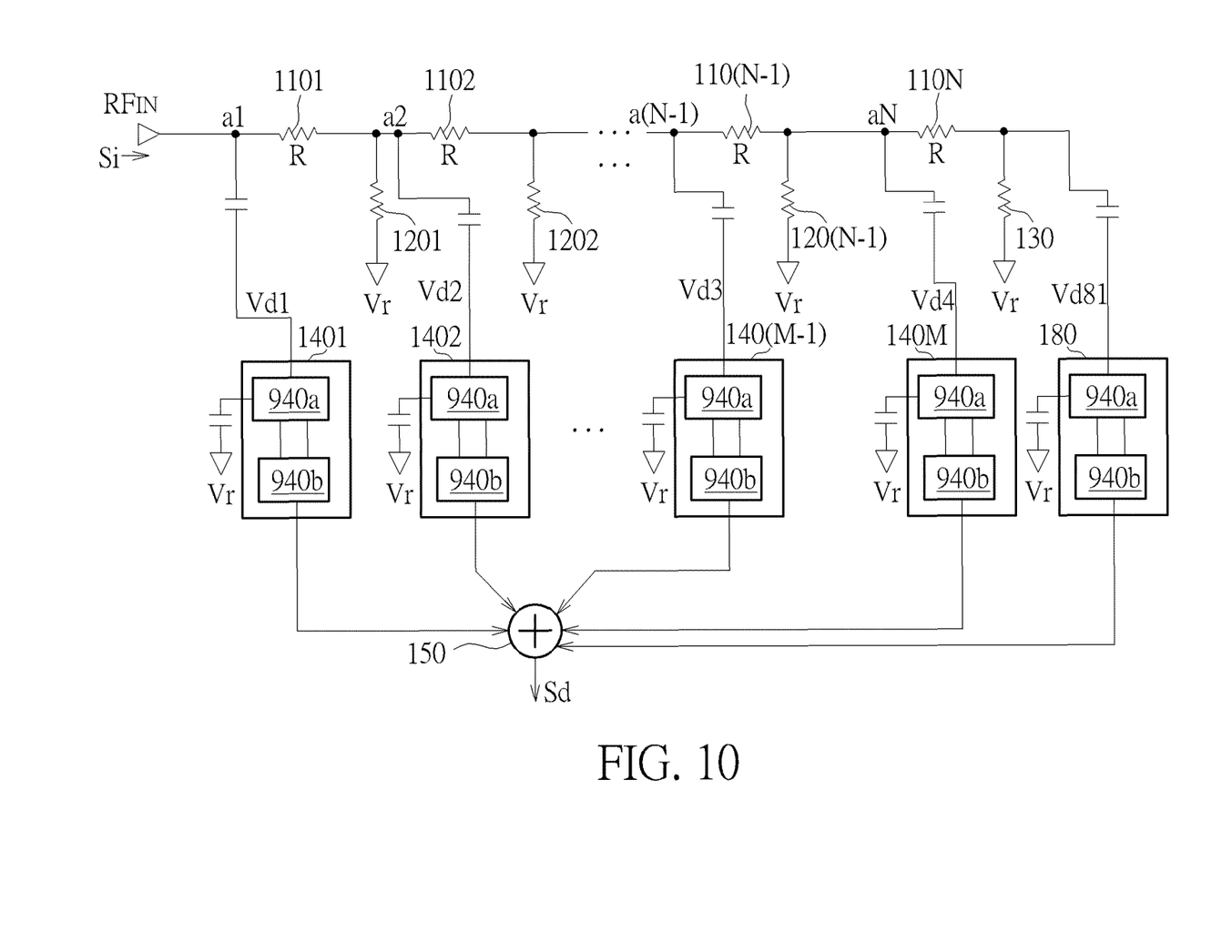
FIG. 10 illustrates a signal detector according to another embodiment.

FIG. 10 illustrates a signal detector 100a according to an embodiment. The signal detector 100a may be similar to the signal detector 100 of FIG. 1, but FIG. 10 illustrates more details. The signal detector 100a may further include the voltage-to-current unit 180 to improve the accuracy of the detection signal Sd. In FIG. 10, each of the voltage-to-current units 1401-140M and 180 may include an amplifier 940a and a rectifier 940b. Hence, the structure may be similar to the structure in FIG. 4. However, the amplifier 940a may be a differential amplifier so that the amplifier 940a may have two input terminals and two output terminals coupled as shown in FIG. 10. An input terminal of the amplifier 940a may be coupled to the first terminal of a corresponding resistor 110i or the first terminal of the resistor 130. Another input terminal of the amplifier 940a may be coupled to the reference voltage terminal Vr. In addition, capacitors may be coupled to the two input terminals of the amplifier 940a to filter out noise. According to an embodiment, when the amplifier is a differential amplifier, the signals outputted from the two output terminals may have reversed phases.

Figure 11:
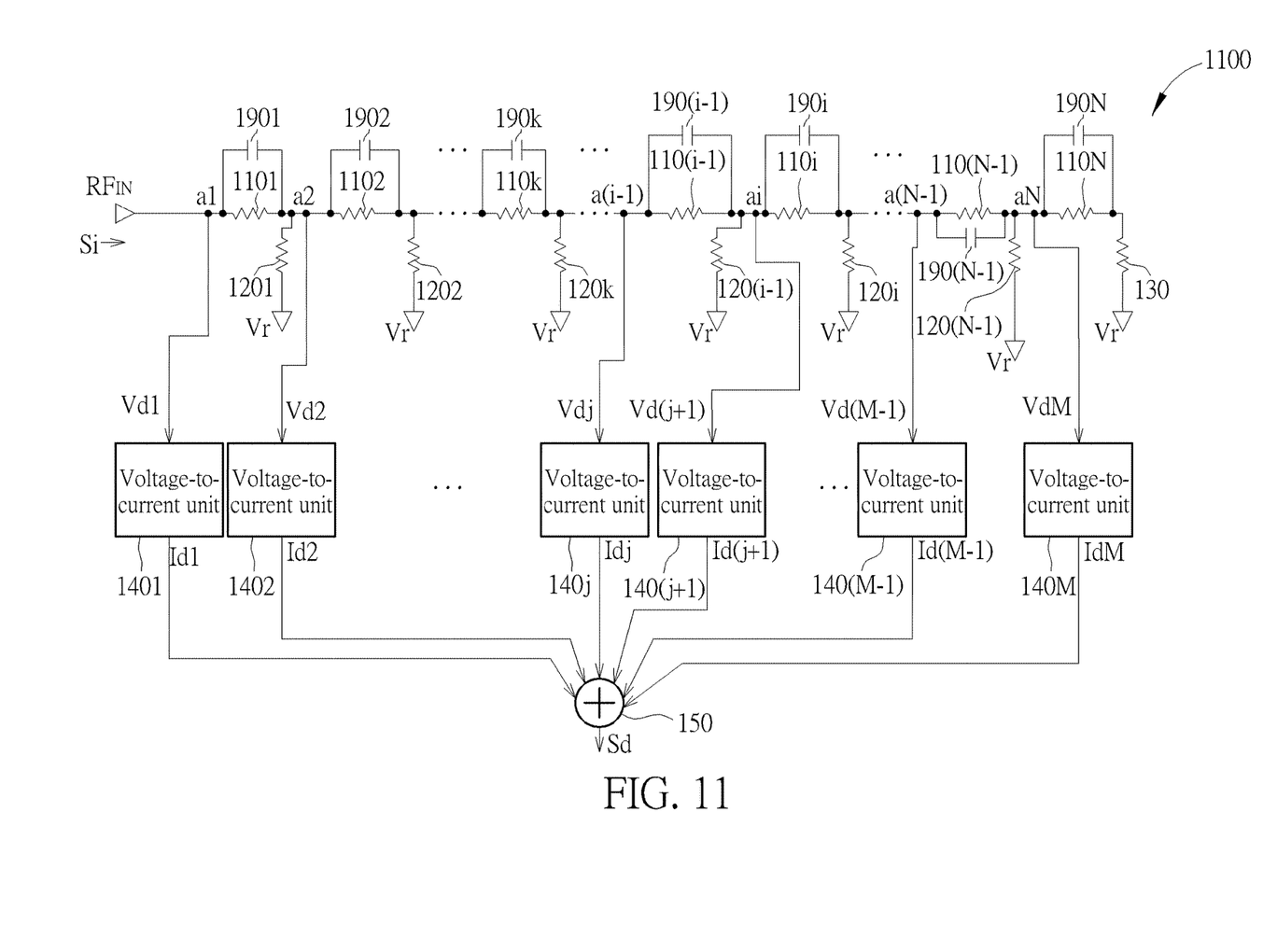
FIG. 11 illustrates a signal detector according to another embodiment.

FIG. 11 illustrates a signal detector 1100 according to an embodiment. The circuit structure and principles of the signal detector 1100 may be similar to the signal detector 100 of FIG. 1, so it is not described repeatedly. Comparing with the signal detector 100, the signal detector 1100 may further include N compensation capacitors 1901-190N. Each of the compensation capacitors 1901-190N may be connected to a corresponding resistor of the resistors 1101-110N in parallel. The compensation capacitor 1901 may be connected to the resistor 1101 in parallel, the compensation capacitor 1902 may be connected to the resistor 1102 in parallel, and so on. The compensation capacitor 190i may be connected to the resistor 110i in parallel, and the compensation capacitor 190N may be connected to the resistor 110N in parallel. In the structure, pre-emphasis may be performed to compensate the roll-off of the gain of the limiting amplifiers. The capacitances of the capacitors 1901-190N may be determined according to the roll-off of the gain. Similarly, in the signal detector 800 of FIGS. 8-9, capacitors with appropriate capacitances may be used optionally to be coupled to the resistors 1101-110N and 8101-810N' to compensate the roll-off of the gain of the amplifiers.

Figure 12:
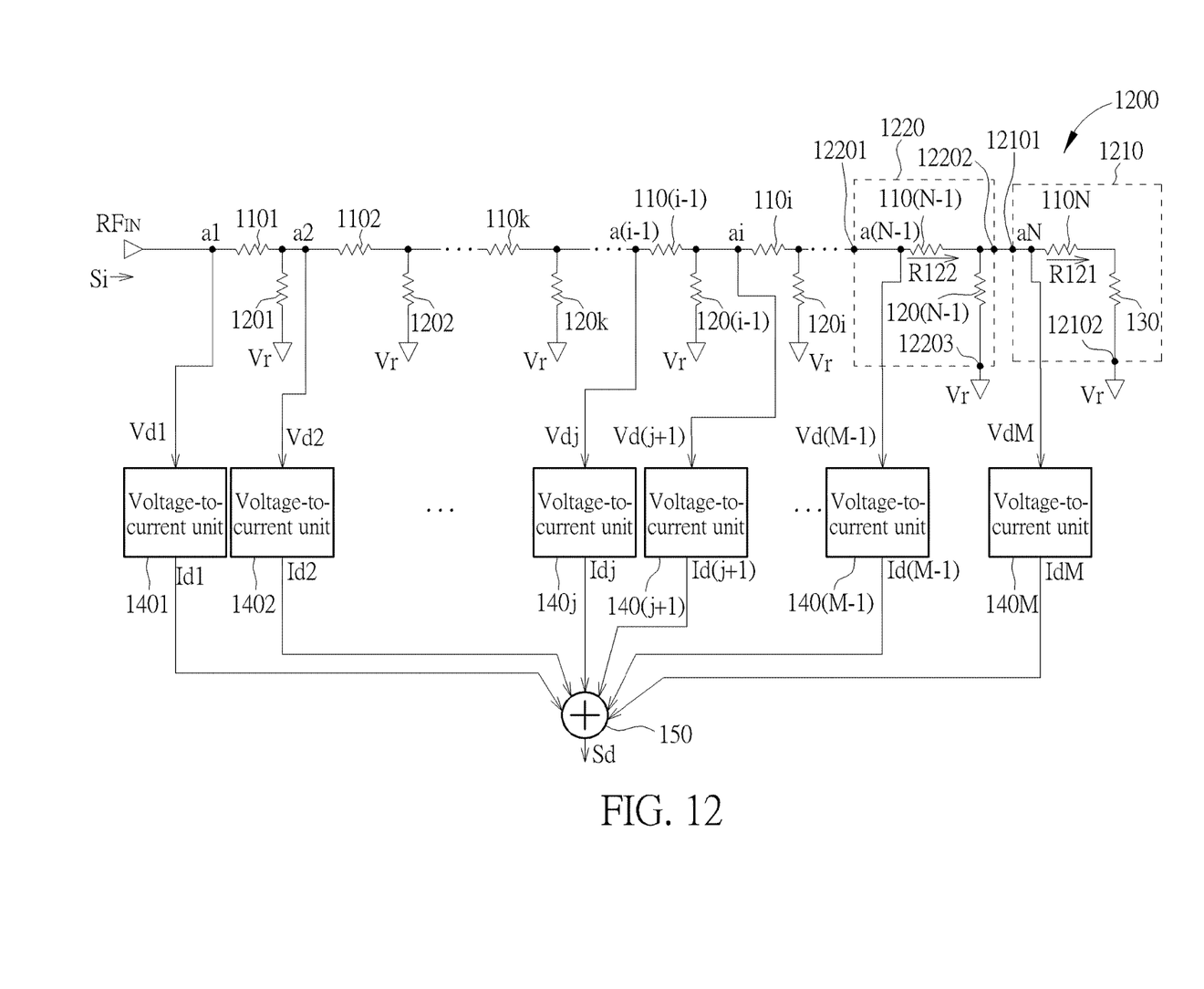
FIG. 12 illustrates a signal detector according to another embodiment.

FIG. 12 illustrates a signal detector 1200 according to an embodiment. The structure of the signal detector 1200 may be similar to the signal detector 100 shown in FIG. 1. As shown in FIG. 12, the signal detector 1200 may include a first attenuation unit 1210 and a second attenuation unit 1220. The first attenuation unit 1210 may include a first node 12101 and a common node 12102 coupled to the reference voltage terminal Vr. As described above, the first attenuation unit 1210 may provide a first equivalent resistance R121 looking from the first node 12101 to the common node 12102. As shown in FIG. 12, the first attenuation unit 1210 may include the resistor 110N, the node aN, and the resistor 130. However, this is an exemplified structure instead of limiting the structure of the first attenuation unit 1210. Furthermore, as shown in FIG. 12, the second attenuation unit 1220 may include the node a(N−1), the resistor 110 (N−1) and the resistor 120(N−1). This is an exemplified structure instead of limiting the structure of the second attenuation unit 1220. The second attenuation unit 1220 may include a first node 12201, a second node 12202 and a common node 12203. For example, if N=2, the first node 12201 may be coupled to the signal input terminal $RF_{IN}$. The second node 12202 may be coupled to the first node 12101 of the first attenuation unit 1210. The second attenuation unit 1220 may provide a second equivalent resistance R122 looking from the first node 12201 to the second node 12202 and the common node 12203. As described above, the first equivalent resistance R121 may be substantially equal to the second equivalent resistance R122. When the parameter N is larger, the signal detector 1200 may include a plurality of the second attenuation units 1220 coupled in series.

In summary, the signal detectors provided according to embodiments of the present invention may perform better than a signal detector of a prior technique regarding total bandwidth, time required to stabilize the amplifiers, reflection coefficient, power transmission ratio, dimensions of passive components (e.g. resistors), accuracy and immunity against environmental factors (e.g. changes of temperatures and variety of manufacture processes). Hence, signal detectors provided by embodiments of the present invention may be helpful in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal detector comprising:
   a signal input terminal;
   N first resistors, wherein a first terminal of a 1st first resistor is coupled to the signal input terminal, and a first terminal of an ith first resistor is coupled to a second terminal of an (i−1)th first resistor;
   (N−1) second resistors, wherein a first terminal of a kth second resistor is coupled to a second terminal of a kth first resistor, and a second terminal of each second resistor is coupled to a reference voltage terminal;
   a third resistor comprising a first terminal coupled to a second terminal of an Nth first resistor and a second terminal coupled to the reference voltage terminal;
   N first nodes wherein a 1st first node is coupled between the signal input terminal and the first terminal of the 1st first resistor, an ith first node is coupled between the second terminal of the (i−1)th first resistor and the first terminal of the ith first resistor;
   M primary voltage-to-current units, wherein each primary voltage-to-current unit comprises a rectifier configured to rectify a corresponding detection voltage to generate a detection current, the each primary voltage-to-current unit further comprises an input terminal coupled to a first terminal of a corresponding first resistor via a corresponding first node to receive the corresponding detection voltage, and comprises an output terminal to output the detection current; and
   a collection unit coupled to output terminals of the M primary voltage-to-current units and configured to generate a detection signal according to at least M detection currents outputted from the M primary voltage-to-current units;
   wherein N, i, k and M are positive integers, 2≤i≤N, 1≤k≤(N−1), 2≤M≤N.

2. The signal detector of claim 1, wherein equivalent resistances looking towards corresponding first resistors from first nodes corresponding to the primary voltage-to-current units are substantially identical.

3. The signal detector of claim 1, wherein a ratio of resistances of each first resistor, each second resistor and the third resistor is 1:2:1, 1:0.75:0.5, or 1:4/9:1/3 substantially.

4. The signal detector of claim 1, wherein the each primary voltage-to-current unit of the M primary voltage-to-current units further comprises:
   an amplifier configured to amplify the detection voltage corresponding to the amplifier so as to generate an amplified signal, and comprising a first terminal to receive the detection voltage corresponding to the amplifier, and a second terminal to send the amplified signal; and
   wherein the rectifier is configured to rectify the amplified signal to generate the detection current, and comprises a first terminal coupled to the second terminal of the amplifier to receive the amplified signal, and a second terminal coupled to an output terminal of the each primary voltage-to-current unit to output the detection current.

5. The signal detector of claim 4, wherein the amplifier is a limiting amplifier.

6. The signal detector of claim 1, wherein
   the rectifier further comprises a first terminal coupled to an input terminal of the each primary voltage-to-current unit to receive the detection voltage, and a second terminal coupled to an output terminal of the each primary voltage-to-current unit to output the detection current.

7. The signal detector of claim 1, further comprising:
   an additional primary voltage-to-current unit configured to convert a corresponding detection voltage to a corresponding detection current, and comprising an input terminal coupled to the second terminal of the Nth first resistor and configured to receive the detection voltage corresponding to the additional primary voltage-to-current unit, and an output terminal coupled to the collection unit and configured to output the detection current corresponding to the additional primary voltage-to-current unit.

8. The signal detector of claim 1, wherein the collection unit includes an adder configured to add at least the M detection currents to obtain a total current and convert the total current to the detection signal.

9. The signal detector of claim 1, wherein the signal input terminal is configured to receive an alternating current signal, and a value of the detection signal corresponds to intensity of the alternating current signal.

10. The signal detector of claim 1, wherein the M primary voltage-to-current units are coupled to the reference voltage terminal.

11. The signal detector of claim 1, further comprising:
    N first compensation capacitors, wherein each of the N first compensation capacitors is coupled in parallel with a corresponding first resistor.

12. The signal detector of claim 1 further comprising:
    a fourth resistor comprising a first terminal coupled to the signal input terminal, and a second terminal;
    N' fifth resistors, wherein a first terminal of a 1st fifth resistor is coupled to the second terminal of the fourth resistor, and a first terminal of an i'th fifth resistor is coupled to a second terminal of an (i'−1)th fifth resistor;
    (N'−1) sixth resistors, wherein a first terminal of a k'th sixth resistor is coupled to a second terminal of a k'th fifth resistor, and a second terminal of each sixth resistor is coupled to the reference voltage terminal;
    a seventh resistor comprising a first terminal coupled to a second terminal of an N'th fifth resistor and a second terminal coupled to the reference voltage terminal;
    N' second nodes wherein a 1st second node is coupled between the second terminal of the fourth resistor and the first terminal of the 1st fifth resistor, and an i'th second node is coupled between the second terminal of the (i'−1)th fifth resistor and the first terminal of the i'th fifth resistor; and
    M' secondary voltage-to-current units, wherein each secondary voltage-to-current unit is configured to convert a corresponding detection voltage to a detection current, comprises an input terminal coupled to a first terminal of a corresponding fifth resistor via a corresponding second node to receive the corresponding detection voltage, and comprises an output terminal to output the detection current;

wherein the collection unit is further coupled to output terminals of the M' secondary voltage-to-current units and configured to generate the detection signal according to at least the M detection currents outputted from the M primary voltage-to-current units and M' detection currents outputted from the M' secondary voltage-to-current units;

wherein N', i', k' and M' are positive integers, $2 \leq i' \leq N'$, $1 \leq k' \leq (N'-1)$, $2 \leq M' \leq N'$.

13. The signal detector of claim 12, wherein equivalent resistances looking towards corresponding fifth resistors from second nodes corresponding to the secondary voltage-to-current units are identical.

14. The signal detector of claim 12 further comprising:
N' second compensation capacitors, wherein each of the N' second compensation capacitors is coupled in parallel with a corresponding fifth resistor.

15. A signal detector comprising:
a signal input terminal configured to receive a received signal;
a first attenuation unit, comprising:
 a first node; and
 a common node coupled to a reference voltage terminal;
 wherein the first attenuation unit is configured to provide a first equivalent resistance looking from the first node to the common node; and
a second attenuation unit, comprising:
 a first node coupled to the signal input terminal;
 a second node coupled to the first node of the first attenuation unit; and
 a common node coupled to the reference voltage terminal;
 wherein the second attenuation unit is configured to provide a second equivalent resistance looking from the first node to the second node and the common node, and the first equivalent resistance is substantially equal to the second equivalent resistance;
a first voltage-to-current unit configured to convert a detection voltage to a detection current, and comprising:
 an input terminal coupled to the first node of the first attenuation unit to receive the detection voltage of the first voltage-to-current unit;
 an output terminal to output the detection current of the first voltage-to-current unit; and
 a rectifier configured to rectify the detection voltage of the first voltage-to-current unit to generate the detection current of the first voltage-to-current unit;
a second voltage-to-current unit configured to convert a detection voltage to a detection current, comprising:
 an input terminal coupled to the first node of the second attenuation unit to receive the detection voltage of the second voltage-to-current unit;
 an output terminal to output the detection current of the second voltage-to-current unit; and
 a rectifier configured to rectify the detection voltage of the second voltage-to-current unit to generate the detection current of the second voltage-to-current unit;
a collection unit coupled to the output terminal of the first voltage-to-current unit and the output terminal of the second voltage-to-current unit, and configured to generate a detection signal according to the detection current of the first voltage-to-current unit and the detection current of the second voltage-to-current unit.

16. The signal detector of claim 15, wherein
the first attenuation unit further comprises:
 a first resistor comprising a first terminal coupled to the first node of the first attenuation unit, and a second terminal; and
 a third resistor comprising a first terminal coupled to the second terminal of the first resistor, and a second terminal coupled to the common node of the first attenuation unit;
the second attenuation unit further comprises:
 a first resistor comprising a first terminal coupled to the first node of the second attenuation unit, and a second terminal coupled to the second node of the second attenuation unit; and
 a second resistor comprising a first terminal coupled to the second node of the second attenuation unit, and a second terminal coupled to the common node of the second attenuation unit.

17. The signal detector of claim 16 further comprising:
a plurality of the second attenuation units coupled in series by the first node of the second attenuation unit and the second node of the second attenuation unit;
a plurality of the second voltage-to-current units configured to convert the detection voltages to the detection currents; and
the collection unit further configured to generate the detection signal according to the detection current of the first voltage-to-current unit and the detection currents of the second voltage-to-current units.

18. The signal detector of claim 17, wherein a resistance of each of the first resistors of the plurality of the second attenuation units, and a resistance of the first resistor of the first attenuation unit, are substantially equal.

19. The signal detector of claim 17, wherein resistances of the second resistors of the plurality of the second attenuation units are substantially equal.

20. The signal detector of claim 15, wherein
the first voltage-to-current unit further comprises:
 an amplifier configured to amplify the detection voltage of the first voltage-to-current unit so as to generate an amplified signal of the first voltage-to-current unit, and comprising a first terminal to receive the detection voltage of the first voltage-to-current unit, and a second terminal to send the amplified signal of the first voltage-to-current unit;
 wherein the rectifier of the first voltage-to-current unit is configured to rectify the amplified signal of the first voltage-to-current unit to generate the detection current of the first voltage-to-current unit, and comprises a first terminal coupled to the second terminal of the amplifier of the first voltage-to-current unit to receive the amplified signal of the first voltage-to-current unit, and a second terminal coupled to the output terminal of first voltage-to-current unit to output the detection current of the first voltage-to-current unit; and
the second voltage-to-current unit further comprises:
 an amplifier configured to amplify the detection voltage of the second voltage-to-current unit so as to generate an amplified signal of the second voltage-to-current unit, and comprising a first terminal to receive the detection voltage of the second voltage-to-current unit, and a second terminal to send the amplified signal of the second voltage-to-current unit;
 wherein the rectifier of the second voltage-to-current unit is configured to rectify the amplified signal of the second voltage-to-current unit to generate the detection current of the second voltage-to-current unit, and comprises a first terminal coupled to the second terminal of the amplifier of the second voltage-to-current unit to receive the amplified signal of the second voltage-to-current unit, and a second terminal coupled to the output terminal of second voltage-to-current unit to output the detection current of the second voltage-to-current unit.

* * * * *